US010293867B2

(12) United States Patent
Sakabe et al.

(10) Patent No.: US 10,293,867 B2
(45) Date of Patent: May 21, 2019

(54) VEHICLE BODY UPPER STRUCTURE

(71) Applicants: TOYOTA JIDOSHA KABUSHIKI KAISHA, Toyota-shi, Aichi-ken (JP); KABUSHIKI KAISHA TOYOTA JIDOSHOKKI, Kariya-shi, Aichi-ken (JP)

(72) Inventors: Motoya Sakabe, Nissin (JP); Takuya Yabe, Toyota (JP); Hirotaka Inaba, Kariya (JP)

(73) Assignees: TOYOTA JIDOSHA KABUSHIKI KAISHA, Toyota (JP); KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 0 days.

(21) Appl. No.: 15/890,569

(22) Filed: Feb. 7, 2018

(65) Prior Publication Data

US 2018/0222537 A1 Aug. 9, 2018

(30) Foreign Application Priority Data

Feb. 8, 2017 (JP) ................................ 2017-021415

(51) Int. Cl.

| | |
|---|---|
| ***H02S 30/10*** | (2014.01) |
| ***B62D 29/04*** | (2006.01) |
| ***B62D 25/06*** | (2006.01) |
| ***H01L 31/048*** | (2014.01) |
| ***H02S 10/40*** | (2014.01) |
| ***B62D 27/02*** | (2006.01) |

(52) U.S. Cl.

CPC ............ *B62D 29/04* (2013.01); *B62D 25/06* (2013.01); *B62D 27/026* (2013.01); *H01L 31/048* (2013.01); *H02S 10/40* (2014.12); *H02S 30/10* (2014.12)

(58) Field of Classification Search

CPC ...... B62D 29/04; B62D 27/026; B62D 25/06; H02S 30/10; H02S 10/40; H01L 31/048

USPC .................................................... 296/193.12

See application file for complete search history.

(56) References Cited

U.S. PATENT DOCUMENTS 6,347,829 B1 * 2/2002 Hanyu .................. B62D 25/06
296/210

8,622,457 B1 * 1/2014 McIntire ................. B60J 7/106
280/756

(Continued)

FOREIGN PATENT DOCUMENTS

EP 2775536 A2 9/2014
JP 5459409 B2 4/2014

(Continued)

*Primary Examiner* — Pinel E Romain

(74) *Attorney, Agent, or Firm* — Oliff PLC

(57) ABSTRACT

A vehicle body upper structure includes a roof support portion constituting a skeleton of an outer peripheral portion of a vehicle body upper portion and a roof which is made of resin, and which supported by the roof support portion. The roof has a bonded portion on a lower surface of the outer peripheral portion of the roof and the bonded portion is joined to an upper surface of the roof support portion via an adhesive. The roof has an extending portion on a lower surface side of a part of the outer peripheral portion of the roof, and the part is closer to a terminal side than the bonded portion and the extending portion extends downwards in a vehicle-height direction.

5 Claims, 3 Drawing Sheets

(56) References Cited

U.S. PATENT DOCUMENTS

| | | | | |
|---|---|---|---|---|
| 9,162,713 | B2 * | 10/2015 | Donabedian | B62D 27/026 |
| 9,242,554 | B2 * | 1/2016 | Shima | B62D 25/06 |
| 2010/0045075 | A1 | 2/2010 | Mack et al. | |
| 2011/0226312 | A1 | 9/2011 | Bohm et al. | |
| 2012/0003034 | A1 | 1/2012 | Inaba et al. | |
| 2013/0200657 | A1 | 8/2013 | Shirai | |
| 2015/0129325 | A1 | 5/2015 | Shirai et al. | |
| 2016/0276513 | A1 | 9/2016 | Inaba et al. | |
| 2018/0277698 | A1 * | 9/2018 | Park | H01L 31/043 |

FOREIGN PATENT DOCUMENTS

| | | | |
|---|---|---|---|
| JP | 2014-144683 | A | 8/2014 |
| JP | 2015-093524 | A | 5/2015 |
| JP | 2016-171271 | A | 9/2016 |
| WO | 2010/017847 | A1 | 2/2010 |

* cited by examiner

VEHICLE BODY UPPER STRUCTURE

INCORPORATION BY REFERENCE

The disclosure of Japanese Patent Application No. 2017-021415 filed on Feb. 8, 2017 including the specification, drawings and abstract is incorporated herein by reference in its entirety.

BACKGROUND

1. Technical Field

The present disclosure relates to a vehicle body upper structure.

2. Description of Related Art

Structures for bonding a roof for a vehicle to a skeleton member of a vehicle body upper portion are known (refer to Japanese Unexamined Patent Application Publication No. 2016-171271 (JP 2016-171271 A) and Japanese Unexamined Patent Application Publication No. 2015-93524 (JP 2015-93524 A)). For example, JP 2016-171271 A discloses a structure in which a lower surface on an outer peripheral portion side of a resinous roof configured of a solar cell module is joined by an adhesive to a skeleton member of a vehicle body upper portion.

SUMMARY

According to the related art described above, an outer side surface of the roof needs to be coated in some case before the roof is bonded to the skeleton member. When a coating agent wraps around a bonded portion (that is, a part bonded to the skeleton member) of the lower surface of the roof during the coating, however, the possibility of a failure of adhesion arises. There is room for improvement in this regard.

The disclosure provides a vehicle body upper structure with which a roof made of resin can be bonded well because a coating agent can be effectively prevented or restrained from wrapping around a bonded portion of a lower surface of the roof even when an outer side surface of the roof is coated.

An aspect relates to a vehicle body upper structure including a roof support portion constituting a skeleton of an outer peripheral portion of a vehicle body upper portion, and a roof made of resin. The roof is supported by the roof support portion. The roof has a bonded portion on a lower surface of the outer peripheral portion of the roof and the bonded portion is joined to an upper surface of the roof support portion via an adhesive. The roof has an extending portion on a lower surface side of a part of the outer peripheral portion of the roof. The part is closer to a terminal side than the bonded portion and the extending portion extends downward in a vehicle-height direction.

According to the aspect, the roof made of resin has the bonded portion on the lower surface of the outer peripheral portion of the roof and the bonded portion is joined to the upper surface of the roof support portion via the adhesive. In addition, the roof has the extending portion on the lower surface side of the part of the outer peripheral portion of the roof. The part is closer to the terminal side than the bonded portion and the extending portion extends to the lower side of the vehicle. Accordingly, even when the outer side surface of the roof is coated before the resinous roof is bonded to the roof support portion, a coating agent can be effectively prevented or restrained from wrapping around the bonded portion on the lower surface of the roof by the extending portion. Therefore, the roof can be bonded well to the roof support portion.

In the vehicle body upper structure according to the aspect, the roof support portion may have roof side portions extending in a front-rear direction of the vehicle on both sides of the vehicle body upper portion. The roof side portion may be configured to include a flange portion protruding to a vehicle-width-direction inner side. A braid may be disposed between a part of the flange portion of the roof side portion on a vehicle-width-direction outer side and a part of the roof on the vehicle-width-direction outer side and the braid may be joined to a surface of the extending portion on the vehicle-width-direction outer side and joined to a lower surface of the extending portion.

According to the aspect, the braid is disposed between the part of the flange portion of the roof side portion on the vehicle-width-direction outer side and the part of the roof on the vehicle-width-direction outer side and the braid is joined to the surface of the extending portion on the vehicle-width-direction outer side and joined to the lower surface of the extending portion. Accordingly, the braid is stably attached and the braid is unlikely to fall on the flange portion of the roof side portion during the bonding of the roof because the contact area of the braid with respect to the flange portion is ensured by the braid extending up to the lower side of the extending portion. As a result, a configuration is possible in which no holding member needs to be additionally disposed on the flange portion during the bonding of the roof to hold a height position of the roof. Since no holding member is disposed, the extension length of the flange portion to the vehicle-width-direction inner side can be suppressed as much as possible.

In the vehicle body upper structure according to the aspect, the roof may include a transparent first layer made of resin, which constitutes an upper surface of the roof and a non-transparent second layer made of resin, which is disposed to overlap at least a vehicle-width-direction outer side part of the first layer on the lower side of the vehicle and having the bonded portion on a lower surface of the second layer, a terminal position of an upper surface of the second layer on the vehicle-width-direction outer side being set to be more displaced to the vehicle-width-direction inner side than a terminal position of a lower surface of the first layer on the vehicle-width-direction outer side. The extending portion may extend to the lower side of the vehicle from an end portion of the second layer on the vehicle-width-direction outer side and a part of the braid may be disposed on the vehicle lower side of a part of the first layer on the vehicle-width-direction outer side not overlapping the second layer.

According to the aspect, the roof is provided with the first layer and the second layer. The first layer is a transparent layer made of resin, which constitutes the upper surface of the roof. The second layer is a non-transparent layer made of resin, which is disposed to overlap at least the vehicle-width-direction outer side part of the first layer on the lower side of the vehicle and has the bonded portion on the lower surface of the second layer. Accordingly, the adhesive on the vehicle lower side of the second layer is hidden by the second layer, and thus appearance quality (appearance) is improved. The terminal position of the upper surface of the second layer on the vehicle-width-direction outer side is set to be more displaced to the vehicle-width-direction inner side than the terminal position of the lower surface of the first layer on the vehicle-width-direction outer side, and the extending portion extends to the lower side of the vehicle from the end portion of the second layer on the vehicle-width-direction outer side. A part of the braid is disposed on the vehicle lower side of the part of the first layer on the vehicle-width-direction outer side not overlapping the second layer. As a result, the length of the braid in the width direction of the vehicle can be ensured and appearance quality (appearance) can be ensured at the same time.

In the vehicle body upper structure according to the aspect, the roof may be configured of a solar cell module provided with a sealing layer in which an electric power generation element is sealed, a resinous surface plate which is made of resin, and which is joined to a light receiving surface side of the electric power generation element of the sealing layer, and a back surface layer which is made of resin and which is joined to a side opposite to the light receiving surface side of the electric power generation element of the sealing layer. The surface plate may have the bonded portion on a lower surface of a part of the surface plate disposed closer to an outer side in a vehicle-width direction than the sealing layer and the back surface layer in plan view of the vehicle.

According to the aspect, the solar cell module constituting the roof made of resin is provided with the surface plate, the sealing layer, and the back surface layer and the sealing layer and the back surface layer hang from the surface plate, and thus the surface plate is likely to vibrate. Accordingly, in the resinous roof configured of the solar cell module, needs to prevent a failure of adhesion between the roof and the roof support portion are even higher. According to the aspect, in contrast, the needs to prevent the failure of adhesion can be satisfied because the coating agent can be effectively prevented or restrained from wrapping around the bonded portion on the lower surface of the roof by the extending portion even when the outer side surface of the roof is coated before the roof is bonded to the roof support portion.

In the vehicle body upper structure according to the aspect, the extending portion may be arranged over an entire circumference of an outer peripheral side of the bonded portion.

With the vehicle body upper structure according to the aspect, the roof can be bonded well since the coating agent can be effectively prevented or restrained from wrapping around the bonded portion on the lower surface of the roof as described above even when the outer side surface of the resinous roof is coated.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
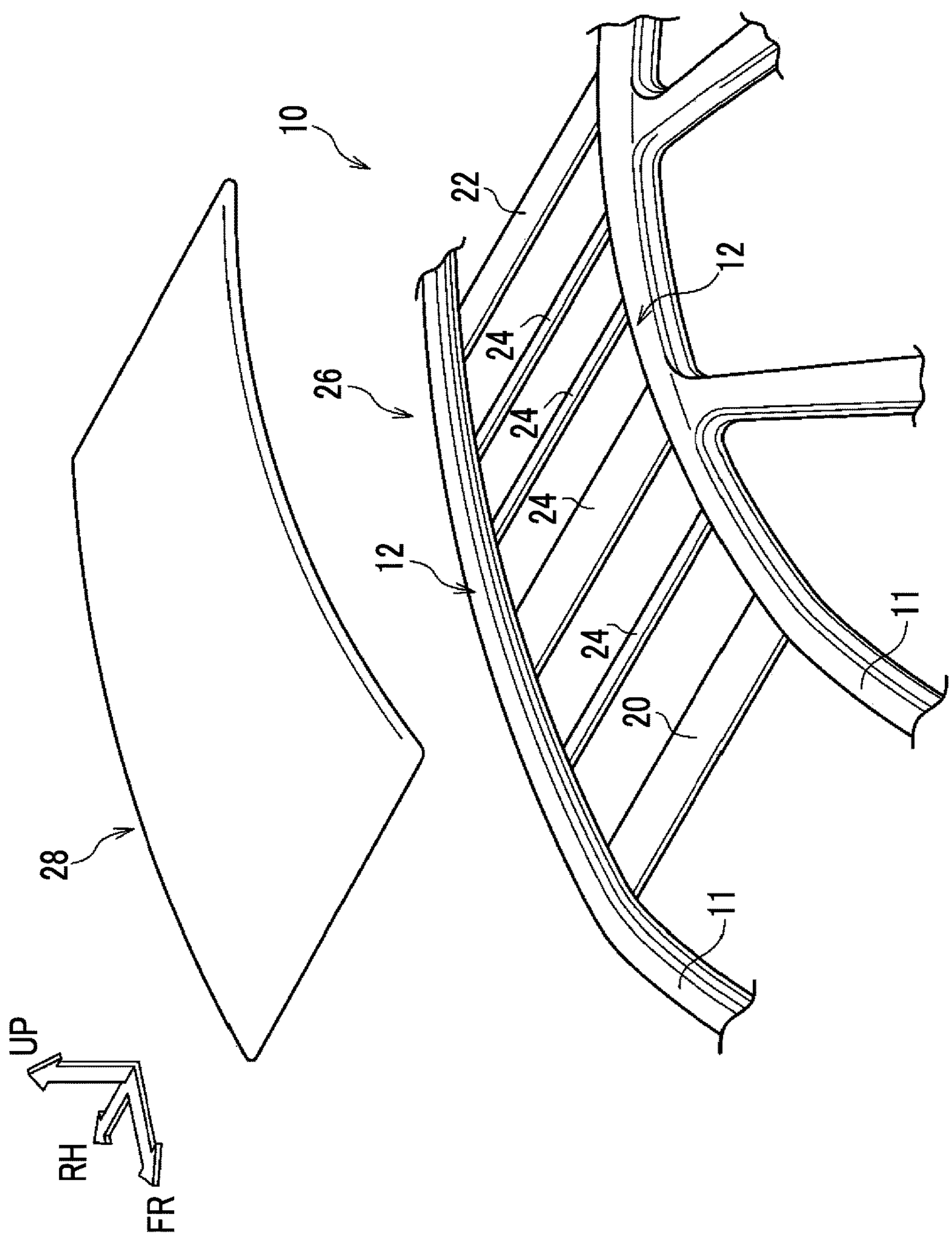
FIG. 1 is an exploded perspective view in which a vehicle body upper structure according to an embodiment is shown in an exploded manner.
Figure 2:
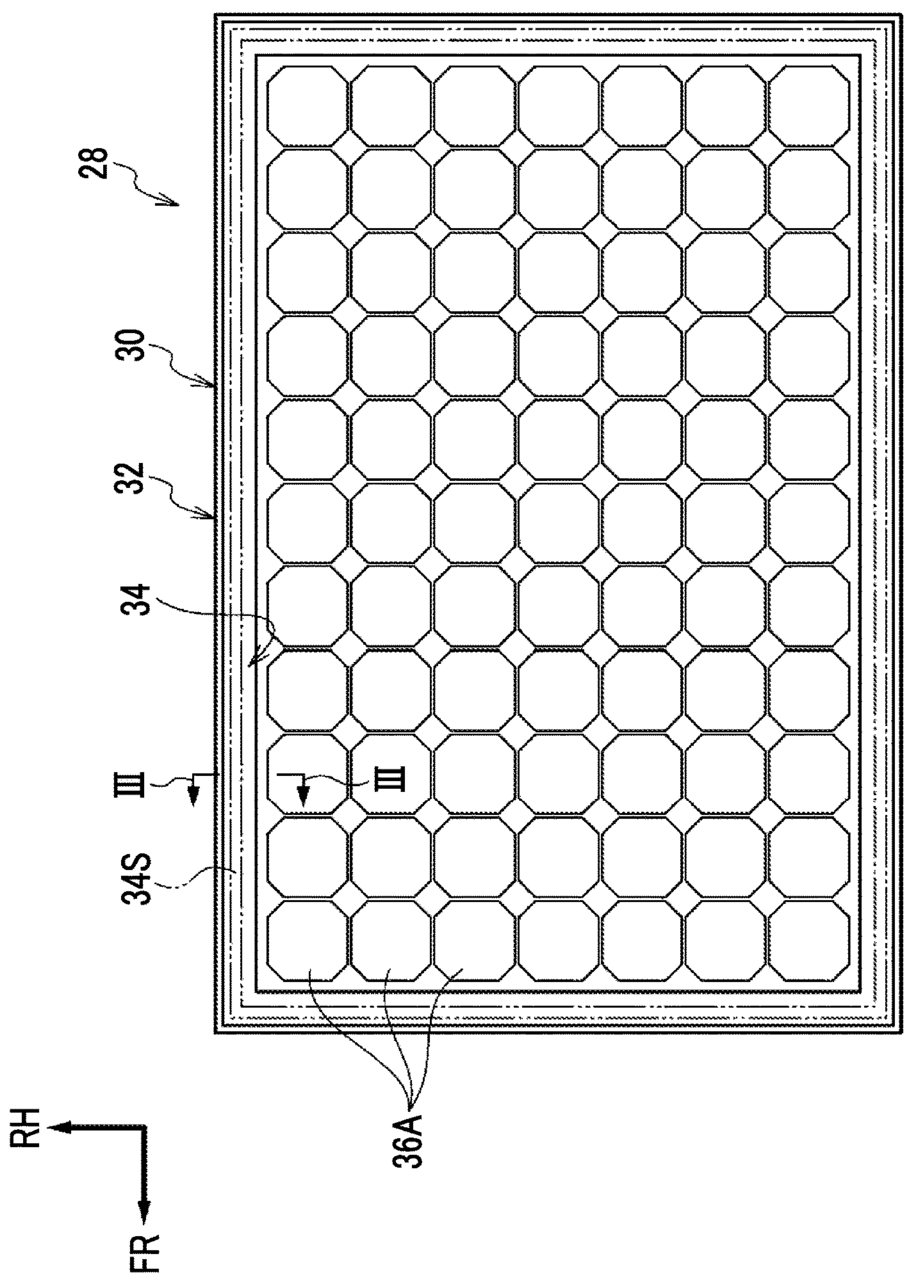
FIG. 2 is a plan view of a solar cell module applied to the vehicle body upper structure according to the embodiment.
Figure 3:
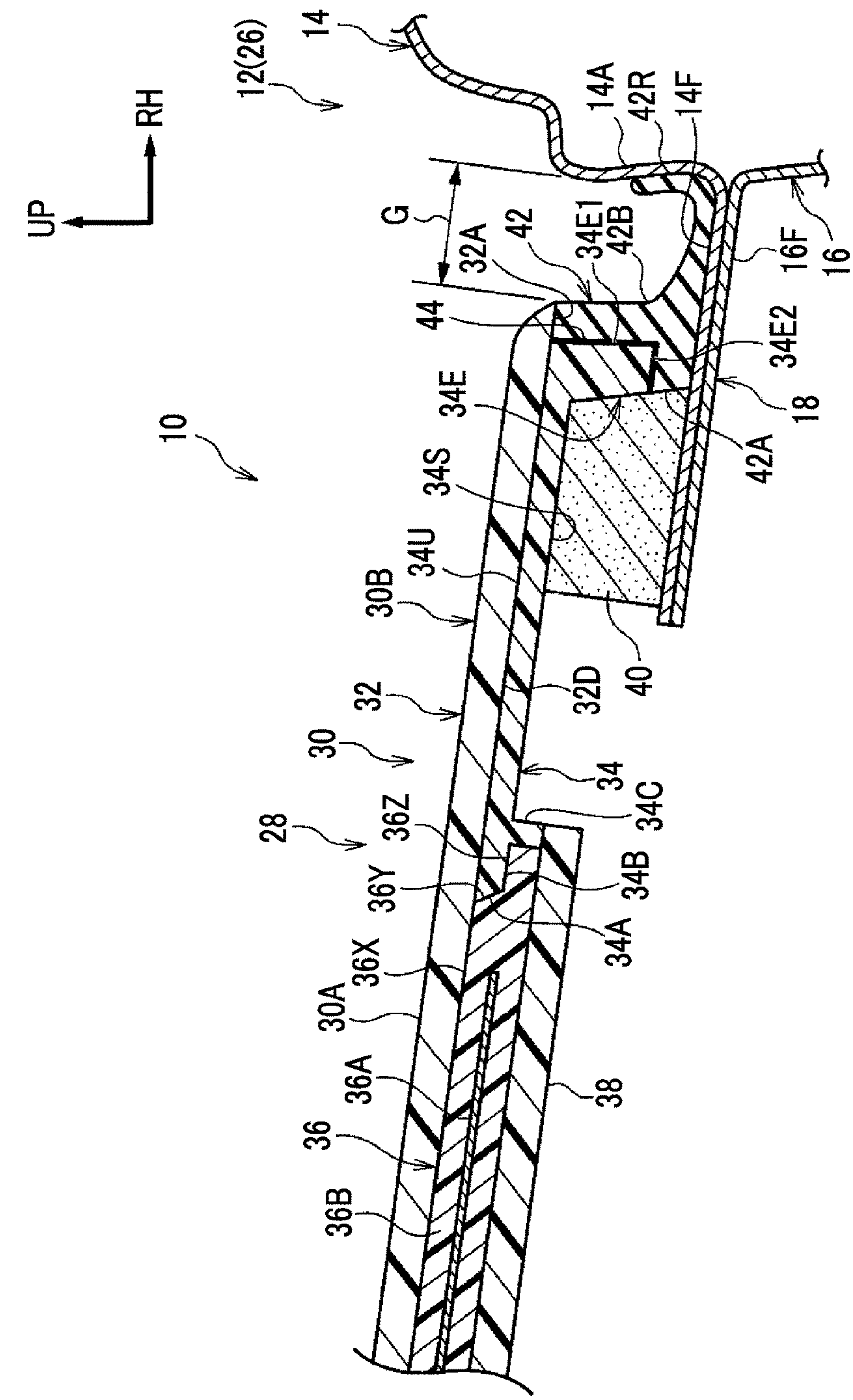
FIG. 3 is a longitudinal sectional view of the vehicle body upper structure according to the embodiment (diagram corresponding to an enlarged cross section cut along line III-III of FIG. 2 when it comes to the solar cell module).

Hereinafter, a vehicle body upper structure according to an embodiment will be described with reference to FIGS. 1 to 3. FIG. 1 is an exploded perspective view of the vehicle body upper structure according to the present embodiment. FIG. 2 is a plan view of a solar cell module applied to the vehicle body upper structure according to the present embodiment. FIG. 3 is a longitudinal sectional view of the vehicle body upper structure according to the present embodiment (diagram corresponding to an enlarged cross section cut along line of FIG. 2 when it comes to the solar cell module). The arrows FR, UP, and RH that are appropriately shown in FIGS. 1 to 3 represent a vehicle front side, a vehicle upper side, and a rightward direction (vehicle right side) in a case where a vehicle is in its traveling direction, respectively. Although a vehicle-right-side cross section of the vehicle body upper structure is illustrated in FIG. 3, a vehicle-left-side cross section of the vehicle body upper structure is bilaterally symmetrical to FIG. 3.

Configuration of Embodiment

As illustrated in FIG. 1, a pair of roof side portions 12 constituting a part of a vehicle body (body) extends in the front-rear direction of the vehicle on both sides of a vehicle body upper portion 10. Front end sides of the roof side portions 12 are continuous to rear end sides of front pillars 11. A part of the roof side portion 12 is illustrated in FIG. 3. As illustrated in FIG. 3, the roof side portion 12 is configured to include an outer panel 14 and an inner panel 16 and a closed cross-sectional portion (not illustrated) extending in the front-rear direction of the vehicle is formed by the outer panel 14 and the inner panel 16. The outer panel 14 is a large panel member and a side outer panel (also referred to as a "side member outer panel") constituting an outer plate in a vehicle body side portion.

The roof side portion 12 is a component portion corresponding to the roof side rail that is disclosed in Japanese Unexamined Patent Application Publication No. 2015-93524 (JP 2015-93524 A) and detailed description thereof will be omitted herein because it is known. The roof side portion 12 is configured to include a flange portion 18 protruding to a vehicle-width-direction inner side. The flange portion 18 according to the present embodiment is a part where a flange portion 14F of the outer panel 14 and a flange portion 16F of the inner panel 16 overlap each other and are joined to each other.

In an alternative configuration of the flange portion of the roof side portion 12, a flange portion of an outer reinforcement (not illustrated) may be disposed between the flange portion 14F of the outer panel 14 and the flange portion 16F of the inner panel 16 and the three flange portions may be joined to one another in a state where the three flange portions overlap one another. In addition, a known outer reinforcement forming the closed cross-sectional portion extending in the front-rear direction of the vehicle with the inner panel 16 and forming the closed cross-sectional portion extending in the front-rear direction of the vehicle with the outer panel 14 can be applied as the outer reinforcement. Examples of the known outer reinforcement include that disclosed in Japanese Unexamined Patent Application Publication No. 2014-144683 (JP 2014-144683 A).

As illustrated in FIG. 1, a front header 20 stretches in the vehicle width direction between front end portions of the roof side portions 12 and a rear header 22 stretches in the vehicle width direction between rear end portions of the roof side portions 12. A plurality of roof reinforcements 24 stretching in the vehicle width direction between the roof side portions 12 is arranged between the front header 20 and the rear header 22. The roof side portions 12, the front header 20, and the rear header 22 constitute a roof support portion 26 constituting a skeleton on an outer peripheral portion side of the vehicle body upper portion 10. A solar cell module 28 constituting a resinous roof is supported by the rectangular frame-shaped roof support portion 26, and the solar cell module 28 is disposed on the vehicle body upper portion 10 to block an opening portion of the roof support portion 26. In other words, a so-called solar roof configured of the solar cell module 28 is applied to the vehicle body upper portion 10.

As illustrated in FIG. 3, the solar cell module 28 is provided with a sealing layer 36 in which a plurality of electric power generation elements (solar cells) 36A is sealed. The sealing layer 36 is a layer in which the electric power generation elements 36A (refer to FIG. 2) are sealed by a sealing material 36B. The electric power generation elements 36A illustrated in FIG. 2 are regularly arranged inside the sealing layer 36 (refer to FIG. 3). The electric power generation elements 36A are known electric power generation elements such as silicon-based cells. The sealing material 36B illustrated in FIG. 3 is transparent and formed of an ethylene-vinyl acetate copolymer (EVA) that has elasticity and adhesiveness.

The thickness of a peripheral end portion 36Z of the sealing layer 36 is set such that it is smaller than that of a general portion 36X of the sealing layer 36, and the peripheral end portion 36Z has an upper surface one step lower than the upper surface of the general portion 36X. A gradual change portion 36Y is formed between the general portion 36X and the peripheral end portion 36Z, and the gradual change portion 36Y has a thickness gradually decreasing from the general portion 36X side toward the peripheral end portion 36Z side.

The solar cell module 28 is also provided with a resinous surface plate 30 joined to a light receiving surface side (upper side in the drawing) of the electric power generation element 36A of the sealing layer 36. The surface plate 30 is formed by two-color molding and provided with a transparent first layer 32 and a non-transparent (such as black) second layer 34. The first layer 32 constitutes the upper surface of the roof. The second layer 34 is disposed to overlap outer peripheral portion side parts of the first layer 32 (specifically, a vehicle-width-direction outer side part and a vehicle-front-rear-direction end portion side part) on the vehicle lower side. The first layer 32 (element that can also be grasped as a clear portion) and the second layer 34 (element that can also be grasped as a black portion in the present embodiment) are formed of, for example, polycarbonate (PC). A resin plate formed of polycarbonate is excellent in weather resistance and is light in weight, and thus is suitable as the surface plate 30 of the solar cell module 28 mounted on the vehicle. The first layer 32 and the second layer 34 will be described in detail later.

The solar cell module 28 is also provided with a resinous back surface layer 38 joined to the side (lower side in the drawing) opposite to the light receiving surface side of the electric power generation element 36A of the sealing layer 36. The back surface layer 38 is formed of polycarbonate as is the case with the surface plate 30 so that buckling of the solar cell module 28 attributable to the adoption of the polycarbonate for the surface plate 30 is prevented. In the present embodiment, the outer-peripheral-side end face of the back surface layer 38 is set closer to a vehicle outer side in plan view of the vehicle than the outer-peripheral-side end face of the sealing layer 36. In the following description, the "vehicle outer side in plan view of the vehicle" will be simply referred to as a "vehicle outer side" and a "vehicle inner side in plan view of the vehicle" will be simply referred to as a "vehicle inner side".

The surface plate 30 is provided with a cover portion 30A covering the sealing layer 36 and the back surface layer 38 in plan view of the vehicle (when seen from the direction of stacking with the sealing layer 36) and an outer peripheral portion 30B disposed closer to the outer side than the sealing layer 36 and the back surface layer 38 in plan view of the vehicle. The majority of the second layer 34 of the surface plate 30 is set in the outer peripheral portion 30B, and the second layer 34 is set to have a rectangular frame shape in plan view of the vehicle as illustrated in FIG. 2. The outer peripheral portion 30B illustrated in FIG. 3 is also set to have a rectangular frame shape in plan view of the vehicle although illustration thereof is omitted herein.

As illustrated in FIG. 3, an end face 34A of the second layer 34 of the surface plate 30 that is on the vehicle inner side is inclined to the vehicle inner side toward the vehicle upper side and is joined to the upper surface of the gradual change portion 36Y of the sealing layer 36. A projecting portion 34C protruding to the vehicle lower side is formed at a part of the second layer 34 of the surface plate 30 that is on the vehicle inner side, and a surface of the projecting portion 34C on the vehicle outer side is aligned with the outer-peripheral-side end face of the back surface layer 38. A surface of the projecting portion 34C on the vehicle inner side is joined to the outer-peripheral-side end face of the peripheral end portion 36Z of the sealing layer 36, and the lower surface of the projecting portion 34C is joined to the upper surface of the back surface layer 38 on a terminal side. A surface 34B of the second layer 34 connecting the projecting portion 34C and the end face 34A on the vehicle inner side to each other is joined to the upper surface of the peripheral end portion 36Z of the sealing layer 36.

The terminal position of an upper surface 34U of the second layer 34 on the vehicle outer side (vehicle-width-direction outer side in the cross section of FIG. 3) is set to be more displaced to the vehicle inner side (vehicle-width-direction inner side in the cross section of FIG. 3) than the terminal position of a lower surface 32D of the first layer 32 on the vehicle outer side (vehicle-width-direction outer side in the cross section of FIG. 3). The lower surface of the solar cell module 28 at the outer peripheral portion side part, that is, the lower surface of the second layer 34 in the outer peripheral portion 30B of the surface plate 30 has a bonded portion 34S joined via a urethane-based adhesive 40 to the upper surface of the roof support portion 26 (upper surface of the flange portion 18 of the roof side portion 12 in the cross section of FIG. 3). As illustrated in FIG. 2, the bonded portion 34S is disposed over the entire circumference of the outer peripheral portion of the solar cell module 28. As illustrated in FIG. 3, an extending portion 34E extending to the vehicle lower side is formed from the lower surface (lower surface of the second layer 34) side of a part of the outer peripheral portion 30B of the surface plate 30 closer to a terminal side than the bonded portion 34S. In the cross section illustrated in FIG. 3, the extending portion 34E extends to the vehicle lower side from a vehicle-width-direction outer side end portion of the second layer 34. The extending portion 34E is an element that can also be grasped as a rib. The extending portion 34E is formed over the entire circumference of the outer peripheral side of the bonded portion 34S illustrated in FIG. 2.

As illustrated in FIG. 3, a braid 42 is disposed between a vehicle-width-direction outer side part of the flange portion 18 of the roof side portion 12 and a vehicle-width-direction outer side part of the solar cell module 28. The braid 42 extends in the front-rear direction of the vehicle along a vehicle-width-direction outer side end portion of the solar cell module 28. A part of the braid 42 including its upper portion is disposed on the vehicle lower side of a non-overlapping portion 32A that is a vehicle-width-direction outer side part of the first layer 32 and a part not overlapping the second layer 34. The thickness of a part of the braid 42 disposed to the side of the extending portion 34E of the second layer 34 is set equal to the dimension of the non-overlapping portion 32A of the first layer 32 along the vehicle width direction. In addition, a part of the lower portion of the braid 42 is disposed between the extending portion 34E of the second layer 34 and the flange portion 18 of the roof side portion 12. Furthermore, a tip side of a lip portion 42R extending to the vehicle-width-direction outer side from a body portion 42B of the braid 42 is in pressure contact with a vertical wall portion 14A rising from a base end of the flange portion 14F of the outer panel 14.

The braid 42 is joined to a surface 34E1 on the vehicle-width-direction outer side of the extending portion 34E by a double-sided tape 44 (indicated in a simplified manner by a bold line in the drawing) and is joined to a lower surface 34E2 of the extending portion 34E by the double-sided tape 44. In other words, the double-sided tape 44 is pasted continuous to the surface 34E1 and the lower surface 34E2 on the vehicle-width-direction outer side of the extending portion 34E, and the braid 42 is pasted to the two surfaces of the extending portion 34E via the double-sided tape 44. In addition, a surface 42A in the lower portion of the braid 42 and on the vehicle-width-direction inner side is joined to the adhesive 40.

Although not illustrated in detail herein, a braid (not illustrated) is also disposed between the front header 20 and a vehicle-front-side end portion of the solar cell module 28 and between the rear header 22 and a vehicle-rear-side end portion of the solar cell module 28, illustrated in FIG. 1. The braid (not illustrated) extends in the vehicle width direction, and both longitudinal end portions of the braid are disposed adjacent to a longitudinal end portion of the braid 42 (refer to FIG. 3).

Action and Effect of Embodiment

The action and effect of the embodiment will be described below.

According to the configuration described above, the solar cell module 28 constituting the resinous roof illustrated in FIG. 3 has the bonded portion 34S joined to the upper surface of the roof support portion 26 via the adhesive 40 on the lower surface of the solar cell module 28 at the outer peripheral portion side part. The extending portion 34E extending to the vehicle lower side is formed on the lower surface side of the part of the outer peripheral portion side part of the solar cell module 28 closer to the terminal side than the bonded portion 34S. Accordingly, even when the outer side surface (upper surface) of the solar cell module 28 is coated before the solar cell module 28 is bonded to the roof support portion 26, a coating agent can be effectively prevented or restrained from wrapping around the bonded portion 34S on the lower surface of the solar cell module 28 by the extending portion 34E. Therefore, the solar cell module 28 can be bonded well to the roof support portion 26. A known method such as flow coating and spray coating can be applied to the coating.

According to the configuration described above, the solar cell module 28 constituting the resinous roof is provided with the surface plate 30, the sealing layer 36, and the back surface layer 38 and the sealing layer 36 and the back surface layer 38 hang from the surface plate 30, and thus the surface plate 30 is likely to vibrate. Accordingly, in the resinous roof configured of the solar cell module 28, needs to prevent a failure of adhesion between the solar cell module 28 and the roof support portion 26 are even higher. In the present embodiment, in contrast, the needs to prevent the failure of adhesion can be satisfied by the action and effect described above.

As described above, in the vehicle body upper structure according to the present embodiment, the coating agent can be effectively prevented or restrained from wrapping around the bonded portion 34S on the lower surface of the solar cell module 28 by the extending portion 34E even when the outer side surface (upper surface) of the solar cell module 28 constituting the resinous roof is coated. Accordingly, the solar cell module 28 can be bonded well.

In the present embodiment, the braid 42 is disposed between the vehicle-width-direction outer side part of the flange portion 18 of the roof side portion 12 and the vehicle-width-direction outer side part of the solar cell module 28, is joined to the surface 34E1 on the vehicle-width-direction outer side of the extending portion 34E, and is joined to the lower surface 34E2 of the extending portion 34E. Accordingly, the braid 42 is stably attached and the braid 42 is unlikely to fall on the flange portion 18 of the roof side portion 12 during the bonding of the solar cell module 28 because the contact area of the braid 42 with respect to the flange portion 18 is ensured by the braid 42 extending up to the lower side of the extending portion 34E. As a result, a configuration is possible in which no holding member (dam) needs to be additionally disposed on the flange portion 18 during the bonding of the solar cell module 28 to hold a height position of the solar cell module 28. Since no holding member is disposed, the extension length of the flange portion 18 to the vehicle-width-direction inner side can be suppressed as much as possible. As a result, an increase in the mass of the vehicle can be suppressed as much as possible.

More specifically, a gap G is set in view of an assembly error and thermal expansion between an end face of the solar cell module 28 on the vehicle-width-direction outer side and the outer panel 14 of the roof side portion 12 disposed on a lateral side of the solar cell module 28. The difference between the linear expansion coefficient of the resin material constituting the solar cell module 28 and the linear expansion coefficient of the steel material constituting the outer panel 14 is larger than the linear expansion coefficient difference between a glass material and a steel material. Accordingly, the gap G needs to be set wider than a gap between the roof and the outer panel 14 in a case where a glass material is used and, as such, the extension length of the flange portion 18 of the roof side portion 12 (at least the extension length of the flange portion 14F of the outer panel 14) is set long. Therefore, any more extension of the extension length of the flange portion 18 needs to be suppressed as much as possible.

In this regard, the outer panel 14 provided with the flange portion 14F is a large panel member, and thus manufacturing an outer panel in a case where a resinous roof is applied and an outer panel in a case where a glass roof is applied separately from each other is highly disadvantageous in terms of cost. In addition, in a vehicle on which a resinous roof of a solar cell module can be mounted as an option, the flange portion 14F of the outer panel 14 should be set based on the resinous roof. From the background described above, needs to suppress the extension of the extension length of the flange portion 14F of the outer panel 14 as much as possible are even higher. In the present embodiment, the extension length of the flange portion 14F of the outer panel 14 can be suppressed as much as possible as described above.

Since the braid 42 extends up to the lower side of the extending portion 34E, the generation of an abnormal sound between the extending portion 34E and the flange portion 18 of the roof side portion 12 can be suppressed. In addition, since the surface 42A in the lower portion of the braid 42 and on the vehicle-width-direction inner side is joined to the adhesive 40, the braid 42 coming off can be more effectively prevented or suppressed. Furthermore, sealability is further enhanced since the braid 42 is pasted to the two surfaces of the extending portion 34E via the double-sided tape 44.

In the present embodiment, the surface plate 30 of the solar cell module 28 is provided with the first layer 32 and the second layer 34. The first layer 32 is a resinous transparent layer constituting the upper surface of the solar cell module 28. The second layer 34 is a resinous non-transparent layer disposed to overlap the outer peripheral portion side part of the first layer 32 on the vehicle lower side and has a bonded portion 34S on its lower surface. Accordingly, the adhesive 40 on the vehicle lower side of the second layer 34 is hidden by the second layer 34, and thus appearance quality (appearance) is further improved.

The terminal position of the upper surface 34U of the second layer 34 on the vehicle-width-direction outer side is set to be more displaced to the vehicle-width-direction inner side than the terminal position of the lower surface 32D of the first layer 32 on the vehicle-width-direction outer side, and the extending portion 34E extends to the vehicle lower side from the vehicle-width-direction outer side end portion of the second layer 34. Since a part of the braid 42 is disposed on the vehicle lower side of the non-overlapping portion 32A that is a vehicle-width-direction outer side part of the first layer 32 and a part not overlapping the second layer 34, the length of the braid 42 in the vehicle width direction can be ensured and appearance quality (appearance) can be ensured at the same time.

Supplementary Description of Embodiment

In the present embodiment, the resinous roof is a so-called solar roof configured of the solar cell module 28. However, the resinous roof may also be a resinous roof other than the solar roof. In this case, the resinous roof is configured to have a bonded portion joined to the upper surface of the roof support portion 26 via the adhesive 40 on the lower surface of the roof at the outer peripheral portion side part and have an extending portion extending to the vehicle lower side formed on the lower surface side of the part of the outer peripheral portion side part of the roof closer to the terminal side than the bonded portion. A resin other than polycarbonate, such as acrylic resin, may be applied to the resinous roof.

In the embodiment described above, the braid 42 disposed in the flange portion 18 of the roof side portion 12 is joined to the surface 34E1 and the lower surface 34E2 on the vehicle-width-direction outer side of the extending portion 34E. Although the configuration described above is preferable, a configuration can also be adopted in which the braid disposed in the flange portion 18 of the roof side portion 12 is joined to the surface 34E1 on the vehicle-width-direction outer side of the extending portion 34E alone.

In the embodiment described above, the extending portion 34E extends to the vehicle lower side from the vehicle-width-direction outer side end portion of the second layer 34 of the surface plate 30. However, in a modification example of the embodiment described above, the extending portion 34E may extend to the vehicle lower side from a part slightly closer to the vehicle-width-direction inner side than the vehicle-width-direction outer side end portion of the second layer 34 of the surface plate 30.

In the embodiment described above, the surface plate 30 is provided with the first layer 32 and the second layer 34. However, the surface plate may also be a single-layer structure. In the embodiment described above, the second layer 34 is disposed to overlap the vehicle-width-direction outer side part and the vehicle-front-rear-direction end portion side part of the first layer 32 on the vehicle lower side. However, in a modification example of the embodiment described above, a configuration can also be adopted in which the second layer 34 is disposed to overlap the vehicle-width-direction outer side part of the first layer 32 alone on the vehicle lower side.

In the embodiment described above, the terminal position of the upper surface 34U of the second layer 34 on the vehicle-width-direction outer side is set to be more displaced to the vehicle-width-direction inner side than the terminal position of the lower surface 32D of the first layer 32 on the vehicle-width-direction outer side. However, in a modification example of the embodiment described above, the terminal position of the upper surface 34U of the second layer 34 on the vehicle-width-direction outer side and the terminal position of the lower surface 32D of the first layer 32 on the vehicle-width-direction outer side may be aligned with each other.

The embodiment and the modification examples described above can be carried out in a proper combination.

The aspect is not limited to the embodiment that has been described above and it is a matter of course that the aspect can be carried out in various modified forms.

What is claimed is:

1. A vehicle body upper structure comprising:

a roof support portion constituting a skeleton of an outer peripheral portion of a vehicle body upper portion; and a roof made of resin, the roof being supported by the roof support portion, wherein:

the roof has a bonded portion on a lower surface of the outer peripheral portion of the roof and the bonded portion is joined to an upper surface of the roof support portion via an adhesive; and the roof has an extending portion on a lower surface side of a part of the outer peripheral portion of the roof, the part being closer to a terminal side than the bonded portion and the extending portion extending downward in a vehicle-height direction.

2. The vehicle body upper structure according to claim 1, wherein:

the roof support portion has roof side portions extending in a front-rear direction of the vehicle on both sides of the vehicle body upper portion;

the roof side portion is configured to include a flange portion protruding to a vehicle-width-direction inner side; and a braid is disposed between a part of the flange portion of the roof side portion on a vehicle-width-direction outer side and a part of the roof on the vehicle-width-direction outer side and the braid is joined to a surface of the extending portion on the vehicle-width-direction outer side and joined to a lower surface of the extending portion.

3. The vehicle body upper structure according to claim 2, wherein:

the roof includes a transparent first layer made of resin, the transparent first layer constituting an upper surface of the roof, and a non-transparent second layer made of resin, the non-transparent second layer being disposed to overlap at least a vehicle-width-direction outer side part of the first layer on the lower side of the vehicle and having the bonded portion on a lower surface of the second layer, a terminal position of an upper surface of the second layer on the vehicle-width-direction outer side being set to be more displaced to the vehicle-width-direction inner side than a terminal position of a lower surface of the first layer on the vehicle-width-direction outer side; and the extending portion extends to the lower side of the vehicle from an end portion of the second layer on the vehicle-width-direction outer side and a part of the braid is disposed on a vehicle lower side of a part of the first layer on the vehicle-width-direction outer side not overlapping the second layer.

4. The vehicle body upper structure according to claim 1, wherein:

the roof is configured of a solar cell module provided with a sealing layer in which an electric power generation element is sealed, a surface plate made of resin, the surface plate being joined to a light receiving surface side of the electric power generation element of the sealing layer, and a back surface layer made of resin, the back surface layer being joined to a side opposite to the light receiving surface side of the electric power generation element of the sealing layer; and the surface plate has the bonded portion on a lower surface of a part of the surface plate disposed closer to an outer side in a vehicle-width direction than the sealing layer and the back surface layer in plan view of the vehicle.

5. The vehicle body upper structure according to claim 1, wherein the extending portion is arranged over an entire circumference of an outer peripheral side of the bonded portion.

* * * * *